United States Patent
Li et al.

(10) Patent No.: US 10,389,486 B1
(45) Date of Patent: Aug. 20, 2019

(54) PARALLEL PROCESSING OF DIRTY PACKETS IN BLUETOOTH AND BLUETOOTH LOW ENERGY SYSTEMS

(71) Applicant: Cypress Semiconductor Corporation, San Jose, CA (US)

(72) Inventors: Yan Li, Morganville, NJ (US); Jie Lai, Belle Mead, NJ (US); Hongwei Kong, Basking Ridge, NJ (US); Kamesh Medapalli, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/214,974

(22) Filed: Dec. 10, 2018

Related U.S. Application Data

(60) Provisional application No. 62/742,012, filed on Oct. 5, 2018.

(51) Int. Cl.
| | |
|---|---|
| H04J 3/06 | (2006.01) |
| H04L 1/00 | (2006.01) |
| H03M 13/09 | (2006.01) |
| H04L 27/20 | (2006.01) |
| H04W 4/80 | (2018.01) |

(52) U.S. Cl.
CPC .......... *H04L 1/0083* (2013.01); *H03M 13/09* (2013.01); *H04L 1/0054* (2013.01); *H04L 1/0061* (2013.01); *H04L 27/2017* (2013.01); *H04W 4/80* (2018.02)

(58) Field of Classification Search
CPC ... H04L 1/0083; H04L 1/0054; H04L 1/0061; H04L 27/2017; H04W 4/80; H03M 13/09

USPC .................................................. 370/503, 350
See application file for complete search history.

(56) References Cited

U.S. PATENT DOCUMENTS

| | | | | |
|---|---|---|---|---|
| 9,712,951 | B2 * | 7/2017 | Kirshenberg | H04W 28/18 |
| 2003/0031236 | A1 * | 2/2003 | Dahlman | H04B 1/7115 |
| | | | | 375/147 |
| 2015/0327001 | A1 * | 11/2015 | Kirshenberg | H04W 28/18 |
| | | | | 455/41.2 |
| 2016/0173397 | A1 * | 6/2016 | Yajima | H04L 47/31 |
| | | | | 370/230 |
| 2017/0104684 | A1 * | 4/2017 | Seely | H04B 1/06 |
| 2017/0195912 | A1 * | 7/2017 | Tujkovic | H04B 7/026 |
| 2018/0062981 | A1 * | 3/2018 | Richley | H04L 43/106 |
| 2018/0270706 | A1 * | 9/2018 | Tujkovic | H04B 7/026 |

(Continued)

*Primary Examiner* — Chuong T Ho

(57) ABSTRACT

A communication system and method are disclosed for parallel processing of received signals to improve sensitivity of the system. Generally, the method includes demodulating a modulated signal in a first demodulator circuit and a second demodulator circuit in parallel. The first and second demodulated signals are then de-whitened, and a cyclic redundancy code (CRC) check performed on each. If the de-whitened first demodulated signal passes the CRC check a first packet included in the signal is sent to a central processing unit (CPU) for further processing. If the de-whitened second demodulated signal passes the CRC check, and the de-whitened first demodulated signal fails, a second packet included in the de-whitened second demodulated signal is transmitted to the CPU for further processing. In one embodiment, one of demodulator circuits is a GFSK demodulator operated in the phase domain and configured to use maximum likelihood sequence estimation. Other embodiments are also described.

15 Claims, 6 Drawing Sheets

(56) References Cited

U.S. PATENT DOCUMENTS

2018/0270876 A1* 9/2018 Ding .................. H04W 76/10
2019/0028385 A1* 1/2019 Richley ................ H04B 1/06

* cited by examiner

PARALLEL PROCESSING OF DIRTY PACKETS IN BLUETOOTH AND BLUETOOTH LOW ENERGY SYSTEMS

CROSS-REFERENCE TO RELATED APPLICATIONS

This application claims the benefit of priority under 35 U.S.C. 119(e) to U.S. Provisional Patent Application Ser. No. 62/742,012, filed Oct. 5, 2018, which is incorporated by reference herein in its entirety.

TECHNICAL FIELD

This disclosure relates generally to communication systems, and more particularly to Bluetooth systems and methods for parallel processing of received signals to improve signal sensitivity.

BACKGROUND

Recent years have seen the expansion of Bluetooth technology beyond being a standard feature in cell-phones and personal computers into diverse applications including IoT (Internet of Things) systems and devices such as wireless speakers and headphones, cars, wearables and medical devices. Bluetooth (BT) and Bluetooth Low Energy (BLE) are unsurpassed for use in devices and systems that need to wirelessly send short bursts of data over short distances.

A problem for conventional Bluetooth systems, which use a Gaussian frequency-shift keying (GFSK) modulation, is that a test specification established by Bluetooth Special Interest Group™ requires that any Bluetooth receiver be able to receive dirty packets (dirty transmitter or dirty Tx) as specified in either a BT or a BLE test specification. Briefly, as specified in the BT/BLE test standards, in dirty packets, a modulation index keeps changing quickly over time from one dirty packet to the next. For BT basic data rate (BDR), the modulation index of dirty packets jumps up/down for every 20 ms or 16 packets. For Bluetooth Low Energy (BLE) the modulation index of dirty packets jumps up/down for every 50 packets. Besides modulation index changes, carrier frequency offset and symbol timing error are also introduced in the dirty transmitter profile to construct non-ideal dirty signals used in the test, which are within specification limits but deviate from the ideal case.

One possible solution is the use of a GFSK demodulator configured to use maximum likelihood sequence estimation (MLSE) algorithm, which can provide improved received sensitivity. The drawback of a GFSK demodulator using MLSE is that it requires a very accurate estimation of modulation index, typically within ±2%, to achieve any improvement in sensitivity over a conventional, non-MLSE demodulator, and the test specification does not have stringent requirement on GFSK modulation index from transmitter side. For BDR, the required modulation index range is from 0.28 to 0.35. For BLE systems, the required modulation index range is from 0.45 to 0.55. Thus, a modulation index estimation circuity is needed for MLSE demodulator. However, the per-packet estimates of the modulation index are not accurate, especially near a sensitivity threshold of the receiver, due to a short length of the training sequence. Moreover, as noted above in dirty packets or dirty TX, the modulation index keeps changing quickly over time. Thus, in cases where the increased sensitivity of MLSE is needed most, i.e., for dirty packets, it produces results less accurate than for conventional, non-MLSE enabled demodulators.

Accordingly, there is a need for a communication system and method of operating the same to improve receive sensitivity that is not limited by the need for an accurate estimation of the modulation index.

SUMMARY

A communication system and method of operating the same are provided for parallel processing of received signals to improve sensitivity of the system.

In one embodiment, the method includes demodulating a modulated signal in a first demodulator circuit and a second demodulator circuit in parallel (e.g., concurrently and/or simultaneously). The first and second demodulated signals are then de-whitened, and a cyclic redundancy check (CRC) performed on each. If the de-whitened first demodulated signal passes the CRC a first packet included in the signal is selected for further processing. For example, the first packet can be transmitted or sent to a central processing unit (CPU). If the de-whitened second demodulated signal passes the CRC, and the de-whitened first demodulated signal fails, a second packet included in the de-whitened second demodulated signal is selected. If both the de-whitened first and second demodulated signals fail CRC, neither the first packet nor the second packet are selected for further processing or sent to the CPU, but rather are discarded. Generally, one of the two demodulator circuits is configured to use maximum likelihood sequence estimation (MLSE). However, operation of the MLSE demodulator circuit is not enabled by or dependent on a signal based on a modulation index uncertainty estimation of the modulated signal.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

Figure 1:
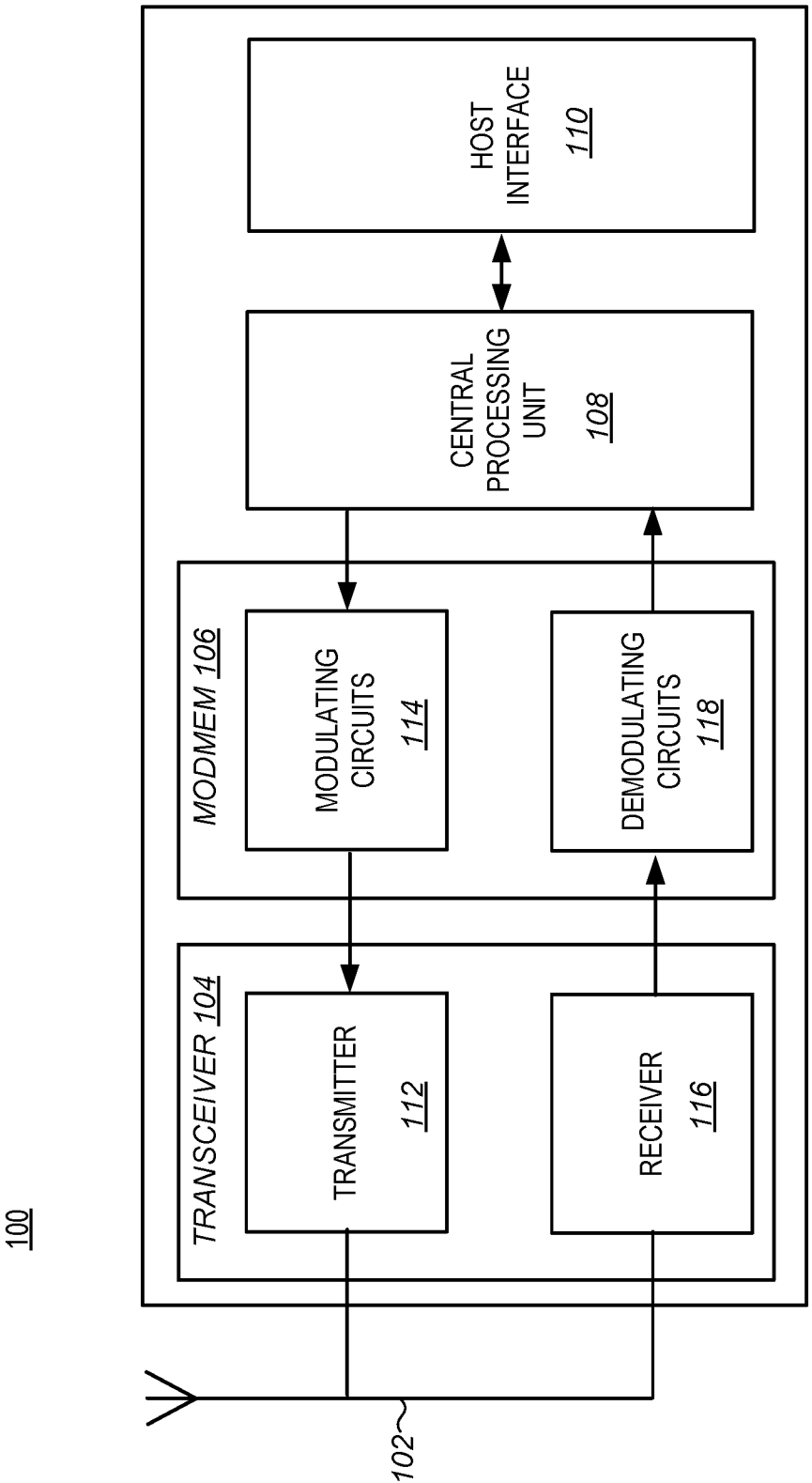
FIG. 1 is a block diagram depicting an embodiment of a portion of a communication system equipped with a demodulating circuit including dual demodulator circuits in parallel signal processing paths in accordance with the present disclosure.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION

A communication system and method are disclosed for parallel processing of received signals to improve sensitivity of the system. The system and method of the present disclosure are particularly useful in low power and short range radio frequency (RF) wireless communication systems or radios, such as Bluetooth (BT) or Bluetooth Low Energy (BLE) systems, which are subject to interference or errors in reception due to transmission of dirty packets or dirty TX. Briefly, the system and method of the present disclosure use first and second Bluetooth demodulator circuits in parallel (e.g., Concurrently and/or simultaneously) for demodulating the modulated signal. In one embodiment, the first demodulator circuit is a Gaussian frequency-shift keying (GFSK) demodulator configured to operate in the frequency domain. The second demodulator circuit may also include a GFSK demodulator, but is configured to operate in the phase domain and to use maximum likelihood sequence estimation (MLSE) to demodulate the modulated signal. The system further includes a number of cyclic redundancy code (CRC) checking circuit, an arbitrator and a switching circuit or multiplexor (MUX) for selecting either a first packet included in a demodulated signal from the first demodulator circuit or a second packet included in a demodulated signal from the second demodulator circuit to be transmitted or sent to a processor in the communication system. The use of MLSE in the phase domain can provide up to about 3 dB improvement in receive sensitivity for Bluetooth demodulation when symbols received are not independent, and/or there is appreciable intersymbol interference (ISI).

Before describing the various embodiments in more detail, further explanation shall be given regarding certain terms that may be used throughout the descriptions.

By "dirty packets or dirty TX" it is meant a packet as specified in BT test standards, in which the modulation index keeps changing quickly over time. For basic data (BDR), the modulation index jumps up/down for every 20 ms or 16 packets. For Bluetooth Low Energy (BLE) the modulation index jumps up/down for every 50 packets. Besides modulation index changes, carrier frequency offset and symbol timing error are also introduced in the dirty transmitter profile to construct non-ideal dirty signals used in the test. By modulation index it is meant how much the frequency of frequency-shift keying (FSK) modulated signal can be deviated from an unmodulated level, with respect to the symbol rate. For example, in a BLE system using a LE 1M physical layer and having a symbol rate of 1 mega symbol per second (Ms/s), the frequency deviation is ±250 kHz if the modulation index is 0.5.

By maximum likelihood sequence estimation (MLSE) it is meant a mathematical algorithm to extract useful data out of a noisy data stream. MLSE techniques for data communication are described, for example, in section 9.3 in J. G. Proakis, "Digital Communications, 5th Edition", New York: McGraw-Hill, 2007. Generally, for a GFSK modulated signal, an MLSE estimator applies to a hypothesized bit sequences a modulation index estimate, and compares the results with the received data to see which hypothesized sequence is the closest match.

By intersymbol interference (ISI) it is meant is a form of distortion of a signal in which one symbol interferes with subsequent symbols.

FIG. 1 is a simplified block diagram depicting an embodiment of a communication system 100, such as a Bluetooth (BT) or Bluetooth Low Energy (BLE) radio, equipped with a demodulating circuit including parallel signal processing paths in accordance with the present disclosure. Since communication system in general and radios in particular are well known in the art, detailed descriptions of well-known functions and structures incorporated of the communication system 100 depicted in FIG. 1 have been omitted to avoid obscuring the subject matter of the present disclosure.

Referring to FIG. 1, the communication system 100 generally includes an antenna 102, a radio frequency (RF) transceiver 104, a modem 106, a central processing unit (CPU 108), such as a Microprocessor and Memory Unit (µPU), and one or more host interfaces 110 thru which the communication system communicates with a host computer or device (not shown). The RF transceiver 104 includes a transmitter 112 configured to transmit signals provided by a modulating circuit 114 in the modem 106 and a receiver 116 receive modulated signals and provide the modulated signals to demodulating circuit 118 in the modem for processing. Additionally, the communication system 100 may further include a number of band pass filters, amplifiers and analog-to-digital converters (ADCs) and digital-to-analog converters (DACs) within and through which signals are passed between the antenna 102 and components of the communication system.

In one embodiment, components of the transceiver 104, modem 106, CPU 108 and interfaces 110 are integrally formed or incorporated on a single integrated circuit (IC) chip. The antenna 102 can also be integrally formed on the same IC chip, or on a separate chip or substrate packaged in a single multi-chip IC package with the IC chip including the transceiver 104, modem 106, CPU 108 and interfaces 110. Alternatively, the antenna 102, as well as other components of the communication system 100 can be separately implemented on a printed circuit board (PCB) to which the IC chip including the transceiver 104, modem 106, CPU 108 and interfaces 110 are mounted or attached.

Figure 2A:
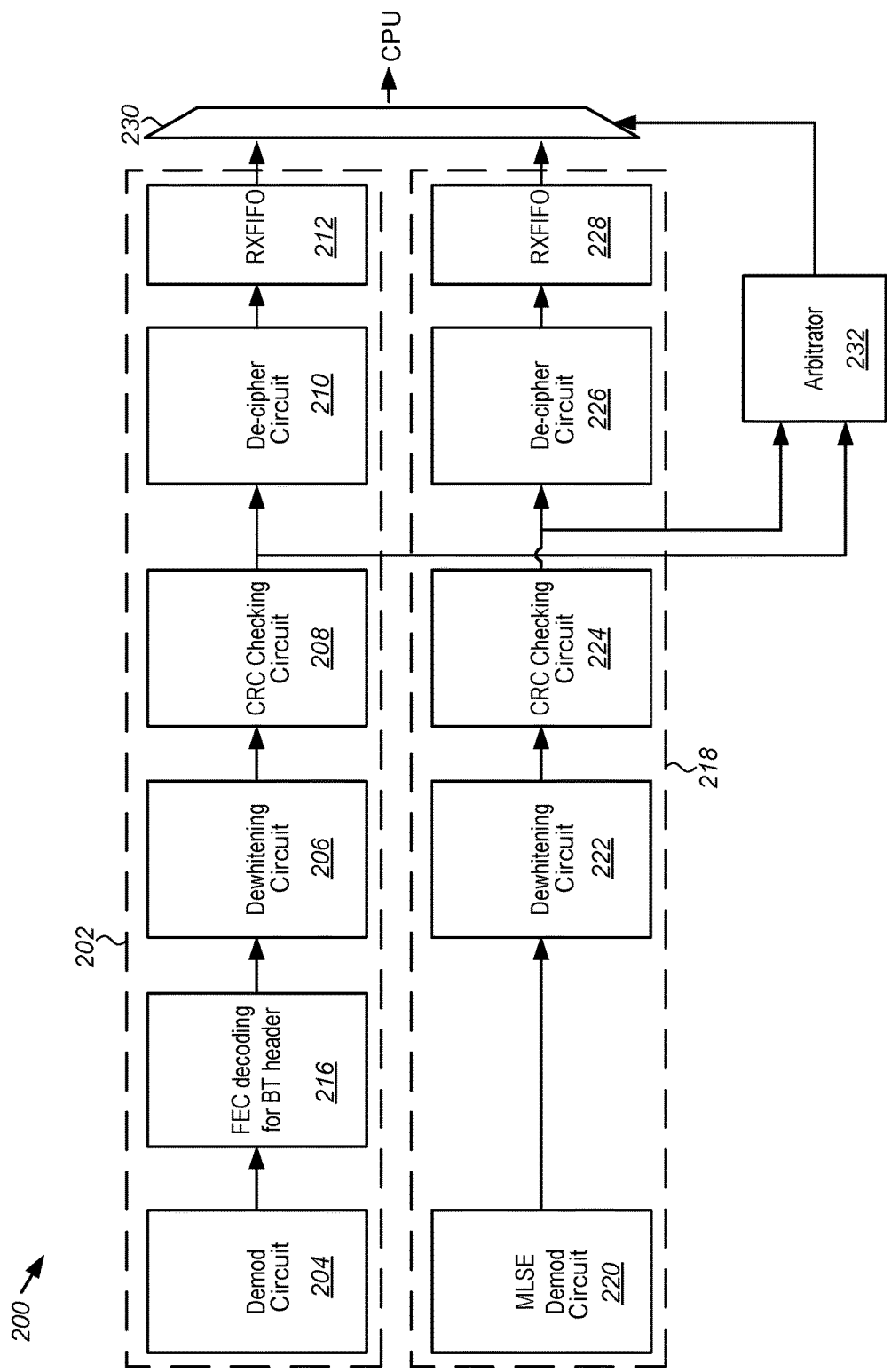
FIG. 2A is a block diagram depicting an embodiment of a demodulating circuit including dual demodulator circuits in parallel signal processing paths in accordance with the present disclosure.

Embodiments of a demodulating circuit including dual demodulator circuits in parallel signal processing paths in accordance with the present disclosure will now be described with reference to FIGS. 2A and 2B. Referring to FIG. 2A, the demodulating circuit 200 includes a first signal processing path 202 including a first demodulator circuit 204 for demodulating a modulated signal received from the receiver 116 (shown in FIG. 1), a first de-whitening circuit 206 for de-whitening a first demodulated signal from the first demodulator circuit, and a first cyclic redundancy code (CRC) checking circuit 208 for performing a CRC check on a de-whitened first demodulated signal. Generally, the first signal processing path 202 further includes a first de-cipher circuit 210 for de-ciphering or decoding packets in the de-whitened first demodulated signal, a first receive buffer memory (RXFIFO 212) following and coupled between the first CRC checking circuit 208 and the CPU 108.

In some embodiments, such as that shown, where the demodulating circuit 200 is part of or included in a Bluetooth (BT) or Bluetooth Low Energy (BLE) radio, the first signal processing path 202 further includes a forward error correction (FEC) decoding circuit 216 for correcting and decoding a BT packet header of the first demodulated signal prior to de-whitening. Note that error correction coding only applies to BT packet header and the packet header has to be decoded first to extract the payload length information. The MLSE demodulator circuit is only used to demodulate the payload portion of the packet. If decoding of the packet header fails, the packet is dropped from both signal processing paths.

Generally, the first demodulator circuit 204 is a Bluetooth demodulator circuit or demodulator circuit capable of demodulating BT or BLE signals, such as a Gaussian frequency-shift keying (GFSK) demodulator. In one embodiment, the first demodulator circuit 204 is a GFSK demodulator operated in the frequency domain to slice the frequency estimation output in the frequency domain.

A second signal processing path 218 in parallel with the first signal processing path 202 includes a second demodulator circuit 220 for demodulating the modulated signal in parallel or simultaneously with the first, a second de-whitening circuit 222 for de-whitening a second demodulated signal from the second demodulator circuit, a second CRC checking circuit 224, and in the embodiment shown a second de-cipher circuit 226 for de-ciphering or decoding packets in the de-whitened first demodulated signal, a second RXFIFO 228 following and coupled between the second CRC checking circuit 224 and the CPU 108.

Generally, the second demodulator circuit 220 is also a Bluetooth demodulator circuit capable of demodulating BT or BLE signals, such as a GFSK demodulator or a differential quadrature phase shift keying (DQPSK). In one embodiment, the second demodulator circuit 220 is a GFSK demodulator configured to operate in the phase domain and to use maximum likelihood sequence estimation (MLSE) techniques to demodulate the modulated signal. As noted above, the use of MLSE in the phase domain can provide about 3 dB improvement in receive sensitivity for Bluetooth demodulation when symbols received are not independent, and/or there is appreciable intersymbol interference (ISI). It is further noted, that the operation of the second demodulator circuit 220 is configured to be continuously enabled, and does not require an enable signal based on a potentially uncertain estimate of the modulation index of the modulated signal.

In accordance with the present disclosure the demodulating circuit 200 further includes a switching circuit 230, such as a multiplexer (MUX), coupled between the first and second CRC checking circuits 208, 224, and the CPU (not shown in this figure), and an arbitrating circuit or arbitrator 232 coupled to the first and second CRC circuits to control the switching circuit to select either a first packet included in the de-whitened first demodulated signal or a second packet included in the de-whitened second demodulated signal for further processing and to be transmitted or sent to the CPU. Generally, the arbitrator 232 is configured to send the first packet to the CPU if the de-whitened first demodulated signal passes the CRC check. If the de-whitened first demodulated signal fails the CRC check and the de-whitened second demodulated signal passes the CRC check the second packet is sent to the CPU. If neither the de-whitened first or second demodulated signals pass the CRC check, both the first and the second packet are not sent to the CPU, but rather are discarded.

Figure 2B:
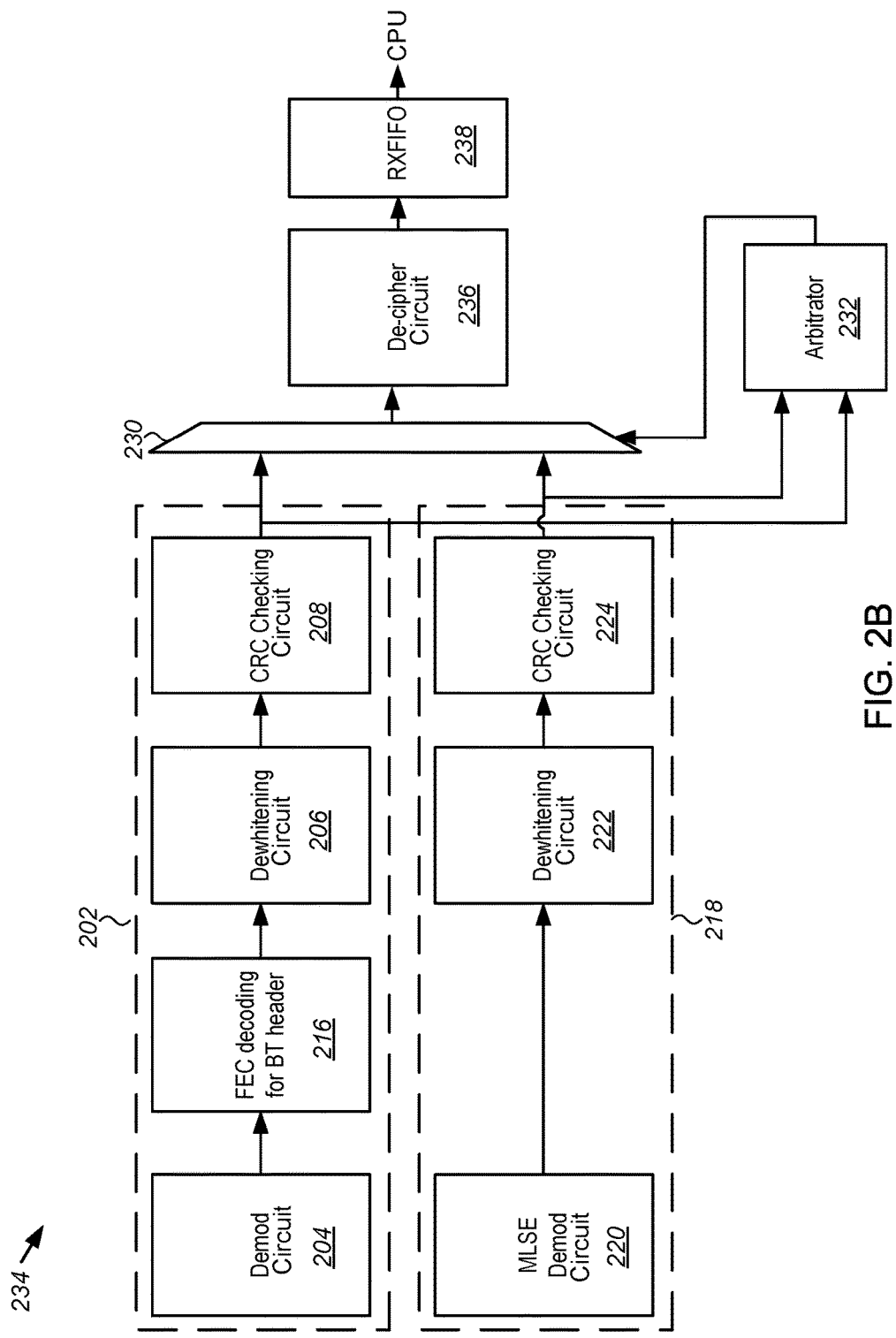
FIG. 2B is a block diagram depicting another embodiment of a demodulating circuit including dual demodulator circuits in accordance with the present disclosure.

In an alternative embodiment of the demodulating circuit 234 shown in FIG. 2B the switching circuit 230 is directly connected to outputs of the first and second CRC checking circuits 208, 224, and the first and second De-cipher circuits 210, 226, and the first and second RXFIO 212, 228, have been replaced with a single shared De-cipher circuit 236 and a single shared RXFIO 238, thereby reducing the cost, size and complexity of the demodulating circuit.

Figure 2C:
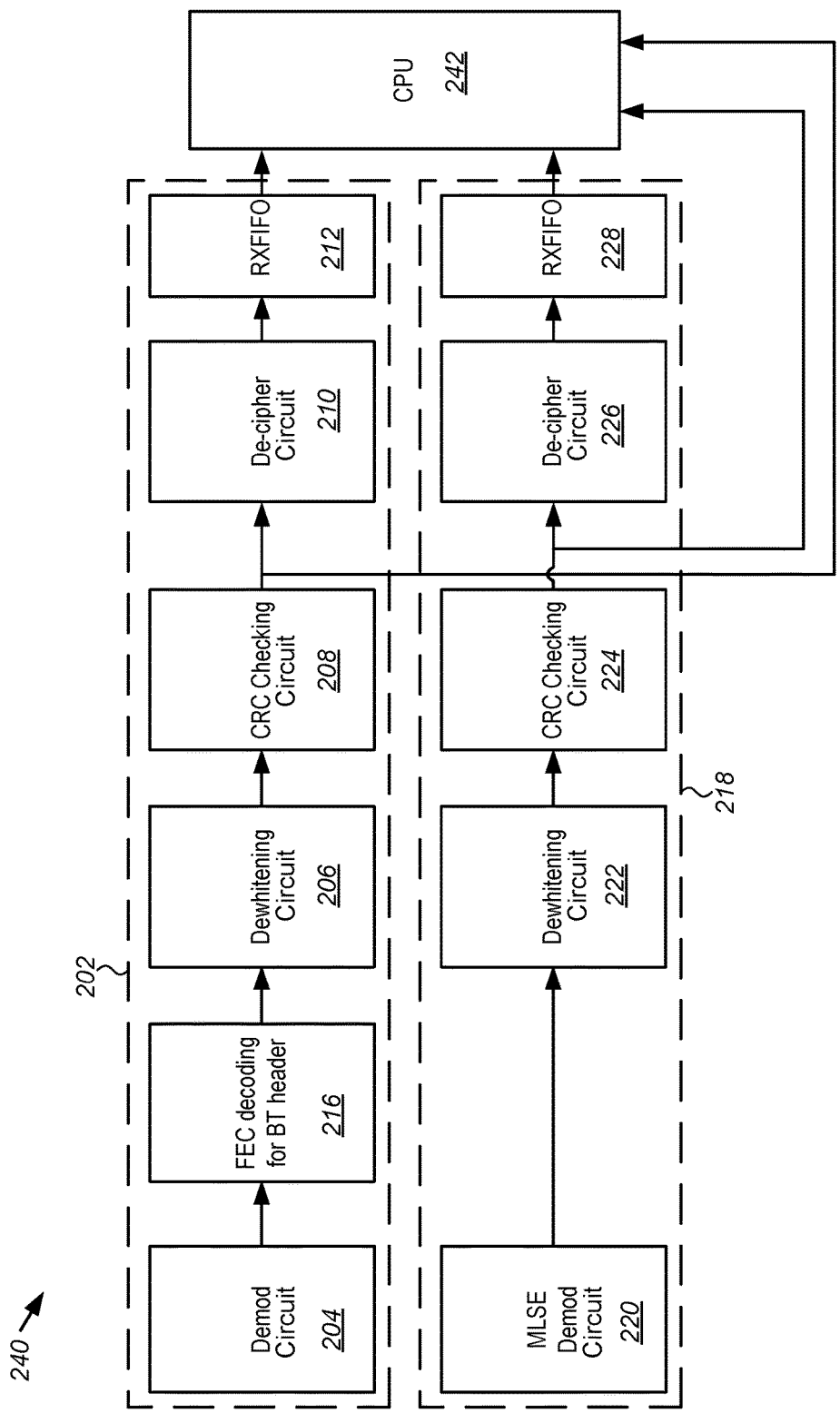
FIG. 2C is a block diagram depicting yet another embodiment of a demodulating circuit including dual demodulator circuits in parallel signal processing paths in accordance with the present disclosure.

In another alternative embodiment of the demodulating circuit 240 shown in FIG. 2C, the arbitrator 232 and the switching circuit 230 have been replaced with a direct connection between outputs of the first and second CRC checking circuits 208, 224, and the CPU 242. Generally, the CPU 242 is programmed or operated such that if the de-whitened first demodulated signal passes the CRC check, the CPU reads from the first packet directly from the first RXFIO 212, without the need for an intervening switching circuit. However, if the de-whitened first demodulated signal fails the CRC check and the de-whitened second demodulated signal passes the CRC check the CPU reads from the second packet directly from the second RXFIO 228. If neither the de-whitened first or second demodulated signals pass the CRC check, both the first and the second packet are discarded.

Figure 3:
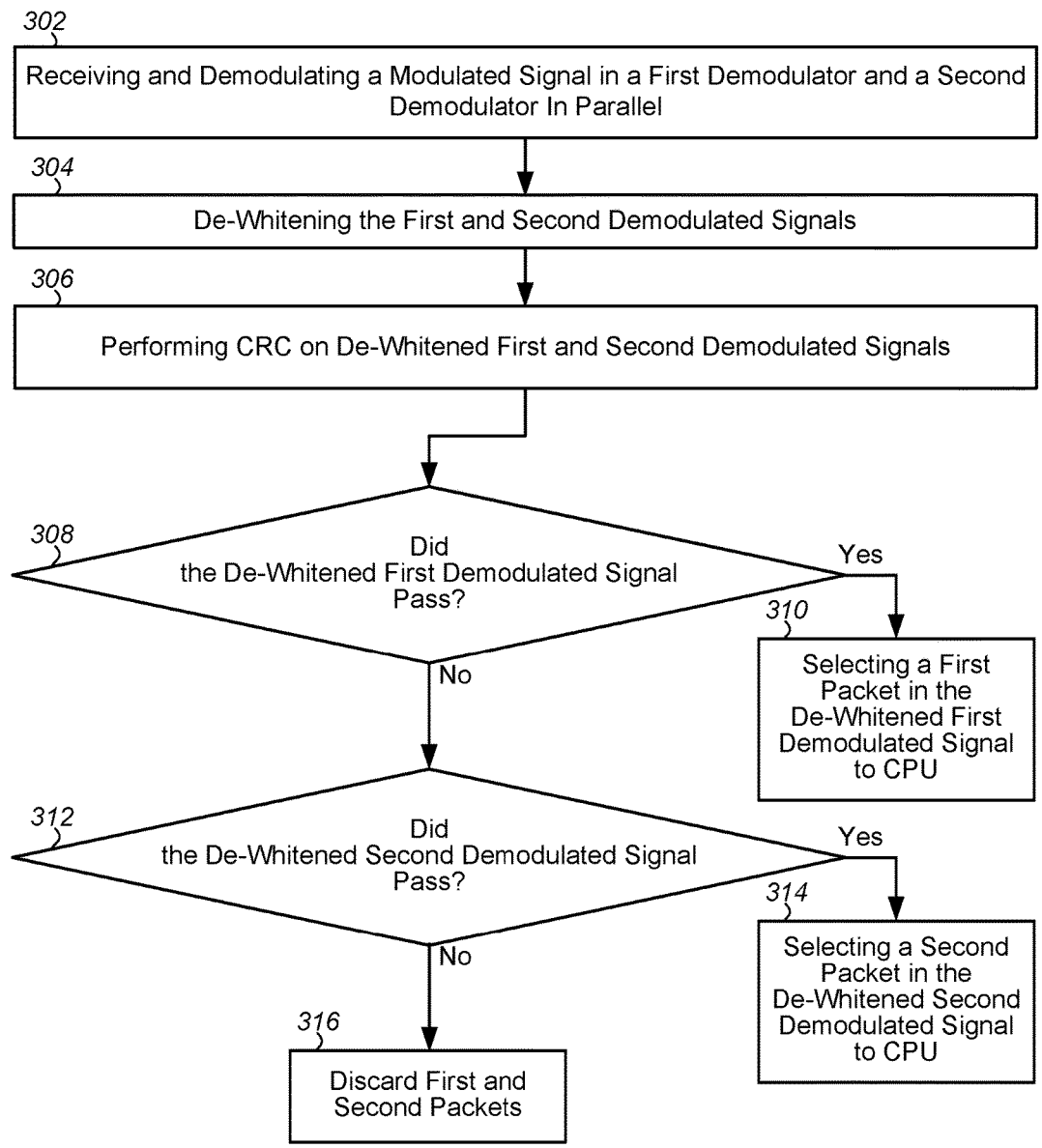
FIG. 3 is a flowchart of a method for operating communication system equipped with a receive signal processor including parallel signal paths to improve sensitivity to received signals.

A method for operating communication system equipped with a receive signal processor including parallel signal paths to improve sensitivity to received signals will now be described with reference to the flowchart of FIG. 3. Referring to FIG. 3, the method begins with, in parallel or concurrently, demodulating in a first and a second demodulator circuit a modulated signal including a plurality of packets (302). As described above with reference to FIGS. 2A through 2C, the first demodulator circuit can include a GFSK demodulator operated in the frequency domain. The second demodulator circuit can include a GFSK demodulator operated in the phase domain, and configured to operate to use maximum likelihood sequence estimation (MLSE) to demodulate the modulated signal. As noted above, of the second demodulator circuit is continuously operating, and does not require an enable signal based on an estimation of the modulation index uncertainty of the modulated signal.

The first and second demodulated signals output from the first and second demodulator circuits respectively, are then concurrently de-whitened (304) and cyclic redundancy code (CRC) checks concurrently performed on each of the first and second demodulated signals (306). The de-whitening is performed simultaneously or in parallel in first and second de-whitening circuits, and can be performed or accomplished using any known, standard de-whitening techniques, as described above. Similarly, the CRC check of the de-whitened first demodulated signal is performed or accomplished in a first CRC circuit and the CRC check of the de-whitened second demodulated signal is performed in parallel in a second CRC circuit. Following the de-whitening and CRC checks an arbitrator coupled to outputs of the first and second CRC circuits compares the results of the CRC checks and controls a switching circuit or MUX coupled between the outputs of the first and second CRC circuits and a central processing unit (CPU) to select either a first packet included in the de-whitened first demodulated signal or a second packet included in the de-whitened second demodulated signal to be sent to the CPU through the switching circuit. The arbitrator is configured such that if the de-whitened first demodulated signal passes the CRC check (308) the first packet is selected to be sent to, for example, a CPU for further processing (310). If the de-whitened first demodulated signal fails the CRC check and the de-whitened second demodulated signal passes the CRC (312) the second packet is selected to be sent to the CPU for further processing (314).

If neither the de-whitened first or second demodulated signals pass the CRC check, both the first and the second packet are not sent to the CPU, but rather are discarded (316). Optionally, the arbitrator can signal the CPU that a received packet has been dropped and the CPU can request that one or more packets, including the dropped packet, be retransmitted.

Figure 4:
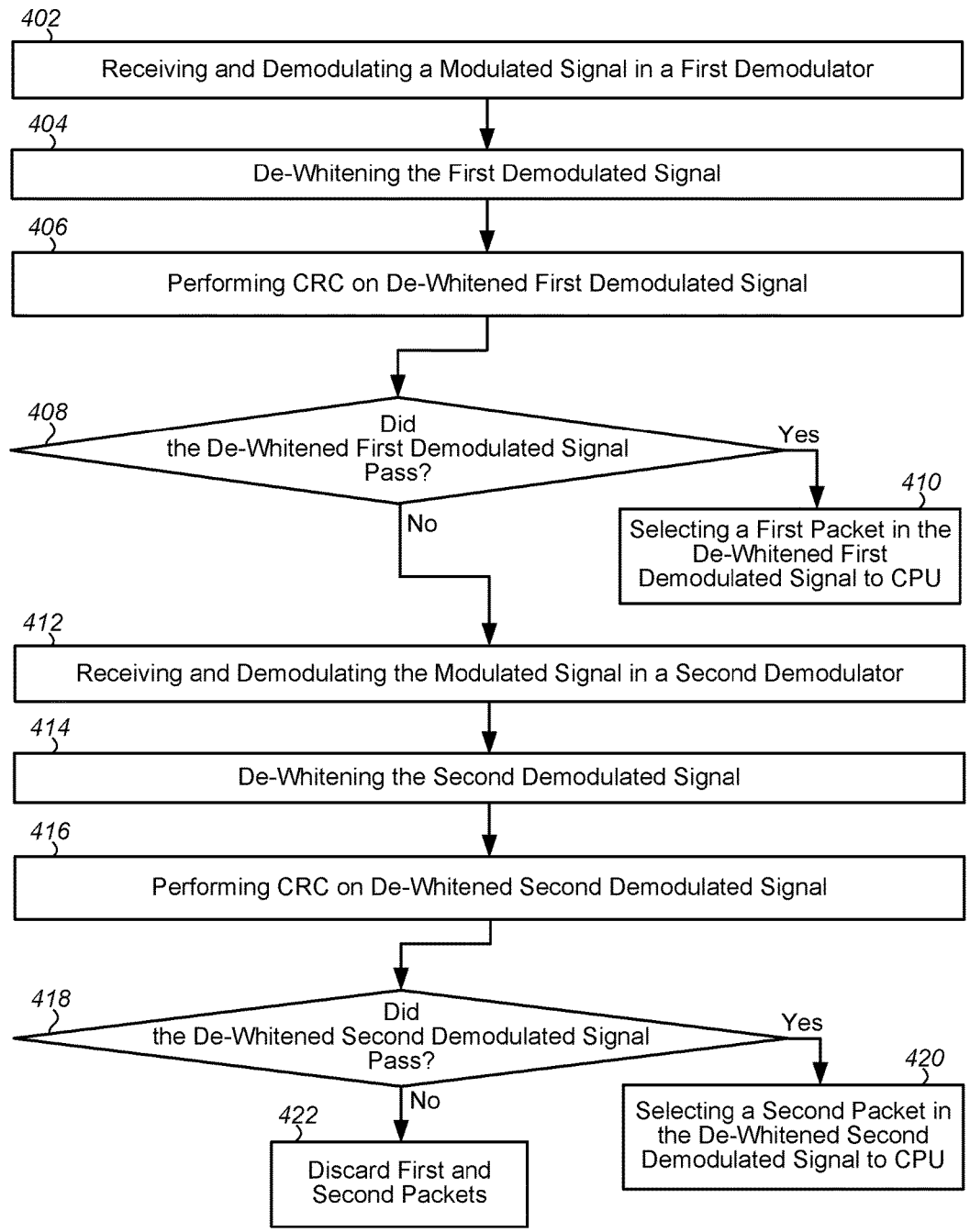
FIG. 4 is a flowchart of another method for operating communication system equipped with dual demodulator circuits, including an MLSE enabled demodulator circuit, to improve sensitivity to received signals.

Another method for operating communication system equipped with dual demodulator circuits to improve sensitivity to received signals will now be described with reference to the flowchart of FIG. 4. Referring to FIG. 4, the method begins with demodulating in a first demodulator circuit a modulated signal including a plurality of packets (402). As described above with reference to FIGS. 2A through 2C, the first demodulator circuit can include a GFSK demodulator operated in the frequency domain. The first demodulated signal output from the first demodulator circuit is then de-whitened (404) and a CRC check performed on the dewhitened first demodulated signal (406). If the de-whitened first demodulated signal passes the CRC check (408) a first packet in the de-whitened first demodulated signal is selected to be sent to the CPU for further processing (410). If the de-whitened first demodulated signal fails the CRC check (408), the modulated signal is demodulated using a second demodulator circuit (412). As described above, the second demodulator circuit can also include a GFSK demodulator operated in the phase domain, and configured to operate to use maximum likelihood sequence estimation (MLSE) to demodulate the modulated signal. The second demodulated signal output from the second demodulator circuit is then de-whitened (414) and a CRC check performed on the dewhitened second demodulated signal (416). If the de-whitened second demodulated signal passes the CRC check (418) a second packet in the de-whitened second demodulated signal is selected to be sent to the CPU for further processing (420). If neither the de-whitened first or second demodulated signals pass their respective CRC checks, both the first and the second packet are not selected or sent to the CPU, but rather are discarded (422).

In yet another embodiment, not shown, a receive signal processor including dual demodulator circuits as described above with reference to FIGS. 2A through 2C, can be operated such that a signal path is selected by an internal or an external switching circuit, based on other criteria other than to improve signal sensitivity. For example, in a demodulating circuit 200 including first and second signal processing paths 202, 218, such as shown in FIG. 2A, either the first or the second signal processing path can be selected for sending a packet of the demodulated signal to the CPU, and the circuits of the other signal processing path turned off or placed in standby to reduce power consumption.

Thus, a communication system and method of operating the same for parallel processing of received signals to improve sensitivity of the system have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A method comprising:
   concurrently demodulating a modulated signal in a first demodulator circuit and a second demodulator circuit, wherein the second demodulator circuit is configured to operate in a phase domain, and to use maximum likelihood sequence estimation (MLSE) to demodulate the modulated signal, and wherein the first and second demodulator circuits comprise Bluetooth demodulator circuits;
   concurrently de-whitening a first demodulated signal from the first demodulator circuit and a second demodulated signal from the second demodulator circuit;
   concurrently performing a cyclic redundancy code (CRC) check on each of the de-whitened first and second demodulated signals;
   selecting a first packet included in the de-whitened first demodulated signal for further processing if the de-whitened first demodulated signal passes the CRC check;
   selecting a second packet included in the de-whitened second demodulated signal for further processing if the de-whitened second demodulated signal passes the CRC check and the de-whitened first demodulated signal fails the CRC check.

2. The method of claim 1 wherein operation of the second demodulator circuit is not enabled by a signal based on a modulation index uncertainty estimation of the modulated signal.

3. The method of claim 1 wherein the first demodulated signal from the first demodulator circuit comprises a Bluetooth (BT) header, and further comprising performing forward error correction (FEC) decoding on the first demodulated signal prior to de-whitening.

4. The method of claim 1 further comprising not transmitting either the first packet or the second packet to the CPU if both the de-whitened first and second demodulated signals fail CRC check.

5. A communication system comprising:
a receiver for receiving a modulated signal;
  a first signal path including a first demodulator circuit for demodulating the modulated signal, a first de-whitening circuit for de-whitening a first demodulated signal from the first demodulator circuit, and a first cyclic redundancy check (CRC) circuit for performing a CRC check on a de-whitened first demodulated signal;
  a second signal path in parallel with the first signal path including a second demodulator circuit for demodulating the modulated signal, a second de-whitening circuit for de-whitening a second demodulated signal from the second demodulator circuit, and a second CRC circuit for performing a CRC check on a de-whitened second demodulated signal, wherein the second demodulator circuit is a Gaussian frequency-shift keying (GFSK) demodulator configured to operate in the phase domain and to use maximum likelihood sequence estimation (MLSE) to demodulate the modulated signal;
  a switching circuit coupled between the first and second CRC circuits and a central processing unit (CPU); and
  an arbitrator coupled to the first and second CRC circuits to control the switching circuit to select either a first packet included in the de-whitened first demodulated signal or a second packet included in the de-whitened second demodulated signal to be transmitted to the CPU through the switching circuit, wherein the arbitrator is configured to:
  transmit the first packet to the CPU if the de-whitened first demodulated signal passes the CRC check;
  transmit the second packet to the CPU if the de-whitened second demodulated signal passes the CRC and the de-whitened first demodulated signal fails the CRC check.

6. The system of claim 5 wherein operation of the second demodulator circuit is configured to be continuously enabled, and without a signal based on a modulation index uncertainty estimation of the modulated signal.

7. The system of claim 5 wherein the arbitrator is further configured to transmit the first packet to the CPU if both the de-whitened first and the second demodulated signals pass CRC check.

8. The system of claim 5 wherein the arbitrator is further configured to drop the first and second packets if both the de-whitened first and second demodulated signals fail CRC check.

9. The system of claim 5 wherein the first demodulated signal from the second demodulator circuit comprises a Bluetooth (BT) header and the first signal path further comprises a forward error correction (FEC) decoding circuit between the first demodulator circuit and the first de-whitening circuit to decode the BT header.

10. The system of claim 5 further comprising a first decipher circuit and a first receive buffer memory (RXFIFO) in the first signal path between the first CRC circuity and the switching circuit, and a second decipher circuit and a second RXFIFO in the second signal path between the second CRC circuity and the switching circuit.

11. The system of claim 5 further comprising a decipher circuit and a receive buffer memory (RXFIFO) between the switching circuit and the CPU.

12. A method comprising:
  receiving and demodulating in a first demodulator circuit a modulated signal including a plurality of packets, wherein the first demodulator circuit comprises a first Bluetooth demodulator;
  de-whitening and performing a cyclic redundancy code (CRC) check on a first demodulated signal from the first demodulator circuit;
  if the first demodulated signal passes the CRC check selecting a first packet included in the first demodulated signal for further processing and sending the first packet to a central processing unit (CPU);
  if the first demodulated signal fails the CRC check, demodulating the received modulated signal in a second demodulator circuit, de-whitening and performing a CRC check on a second demodulated signal from the second demodulator circuit, wherein the second demodulator circuit is a second Bluetooth demodulator configured to operate in a phase domain, and to use maximum likelihood sequence estimation (MLSE) to demodulate the received modulated signal; and
  if the second demodulated signal passes the CRC check selecting a second packet included in the second demodulated signal for further processing and sending the second packet to the CPU.

13. The method of claim 12 wherein operation of the second demodulator circuit is not enabled by a signal based on a modulation index uncertainty estimation of the modulated signal.

14. The method of claim 12 wherein the first demodulated signal from the first demodulator circuit comprises a Bluetooth (BT) header, and further comprising performing forward error correction (FEC) decoding on the first demodulated signal prior to de-whitening.

15. The method of claim 12 further comprising not transmitting either the first packet or the second packet to the CPU if both the de-whitened first and second demodulated signals fail CRC check.

* * * * *